(12) United States Patent
Tran

(10) Patent No.: US 8,379,381 B1
(45) Date of Patent: Feb. 19, 2013

(54) RUGGED SOLID STATE HARD DRIVE WITH SILICONE GEL DAMPING

(75) Inventor: Thanh Tran, Temple City, CA (US)

(73) Assignee: TeleCommunications Systems, Inc., Annapolis, MD (US)

( * ) Notice: Subject to any disclaimer, the term of this patent is extended or adjusted under 35 U.S.C. 154(b) by 105 days.

(21) Appl. No.: 12/930,106

(22) Filed: Dec. 27, 2010

(51) Int. Cl.
 G06F 1/16 (2006.01)
 H05K 5/00 (2006.01)
 H05K 7/00 (2006.01)

(52) U.S. Cl. .......... 361/679.36; 361/679.34; 361/679.33

(58) Field of Classification Search ............. 361/679.36, 361/679.34, 679.33
 See application file for complete search history.

(56) References Cited

U.S. PATENT DOCUMENTS

| 5,355,016 | A | | 10/1994 | Swirbel | |
|---|---|---|---|---|---|
| 5,428,190 | A | * | 6/1995 | Stopperan | 174/261 |
| 5,430,607 | A | | 7/1995 | Smith | |
| 5,623,191 | A | * | 4/1997 | Wieloch | 318/801 |
| 6,365,978 | B1 | | 4/2002 | Ibnabdeljalil | |
| 6,433,409 | B2 | | 8/2002 | Mita | |
| 7,719,828 | B2 | | 5/2010 | Brown | |
| 7,898,074 | B2 | | 3/2011 | Eckhardt | |
| 8,080,880 | B2 | | 12/2011 | Bruenbauer | |
| 8,190,169 | B2 | | 5/2012 | Shim | |
| 2005/0057849 | A1 | * | 3/2005 | Twogood et al. | 360/97.02 |
| 2008/0026723 | A1 | | 1/2008 | Han | |
| 2009/0058830 | A1 | | 3/2009 | Herz | |

OTHER PUBLICATIONS

International Search Report in PCT/US2011/02003 dated Nov. 16, 2012.

* cited by examiner

Primary Examiner — Yuriy Semenenko
Assistant Examiner — Andargie M Aychillhum
(74) Attorney, Agent, or Firm — William H. Bollman

(57) ABSTRACT

A rugged hard drive includes a PC board mounted in an enclosure in a plane that is between, and parallel to two enclosure walls with the PC board being free to flex within the enclosure along an axis of the board when the hard drive is subjected to shock, or vibration, and with the enclosure including gaps, between the board and the inner surfaces of the enclosure, filled with silicone gel to cover electrical components on the board.

5 Claims, 4 Drawing Sheets

RUGGED SOLID STATE HARD DRIVE WITH SILICONE GEL DAMPING

This invention comprises vibration-resistant, rugged hard drives that include a PC board (hereafter called a "PCB") mounted in an enclosure. The PCB is mounted within the enclosure in a plane that is between, and parallel to two walls of the enclosure. In some embodiments, the PCB may be mounted inside the enclosure at each end of the enclosure, leaving the PCB free to flex between these mountings. Between the PCB and each of the two walls are narrow air gaps that provide space for the PCB to move/flex when the hard drive is subjected to shock, vibration, oscillation or other periodic/aperiodic movement. The spacing between the PCB and the inner surface of the enclosure walls may be in the range of about 0.25 mm to about 2 mm. The volumes of the two gaps may be the same or different, and may be in the range of about 1.8 cubic inches to about 23 cubic inches.

To dampen the flexing of the PCB, to improve moisture protection for the PCB, and/or to improve heat conduction away from the PCB, the air gaps may be filled, wholly or partially, with a soft material such as silicone gel. Sufficient silicone gel is placed in the enclosure to cover the IC's and capacitors on the PCB.

In some embodiments, the PCB is made of FR4, and has a length, width and thickness in the ranges of about 2 inches to about 6 inches, of about 1.5 inches to about 4 inches, and of about 0.01 to about 0.12 inch, respectively. In some of these embodiments, the enclosure comprises two mating shallow halves. These halves include a substantially flat rectangular panel having four upstanding walls along each side of the panel, and attachment holes at the corners of the panel. One or both end walls of the enclosure may include openings to receive connectors extending from the PCB.

When mounted between the halves/walls of the enclosure, the PCB may extend near to, but not into contact with the inner surfaces of the enclosure's peripheral walls. The resulting gap at the perimeter of the PCB allows silicone gel to flow from one side of the PCB to the other side inside the enclosure.

BRIEF DESCRIPTION OF THE DRAWINGS

The drawings illustrate an example, or embodiment, of a vibration-resistant, rugged hard drives that include a PC board mounted in an enclosure, and include.

DETAILED DESCRIPTION OF THE DRAWINGS

Figure 1:
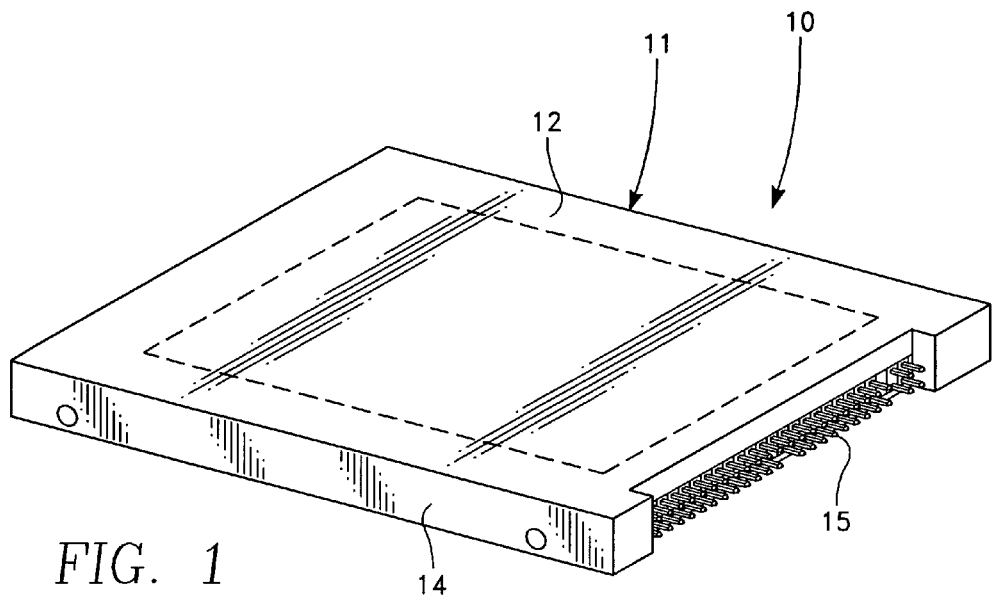
FIGS. 1 and 2, showing top and bottom perspective views of the drive.
Figure 2:
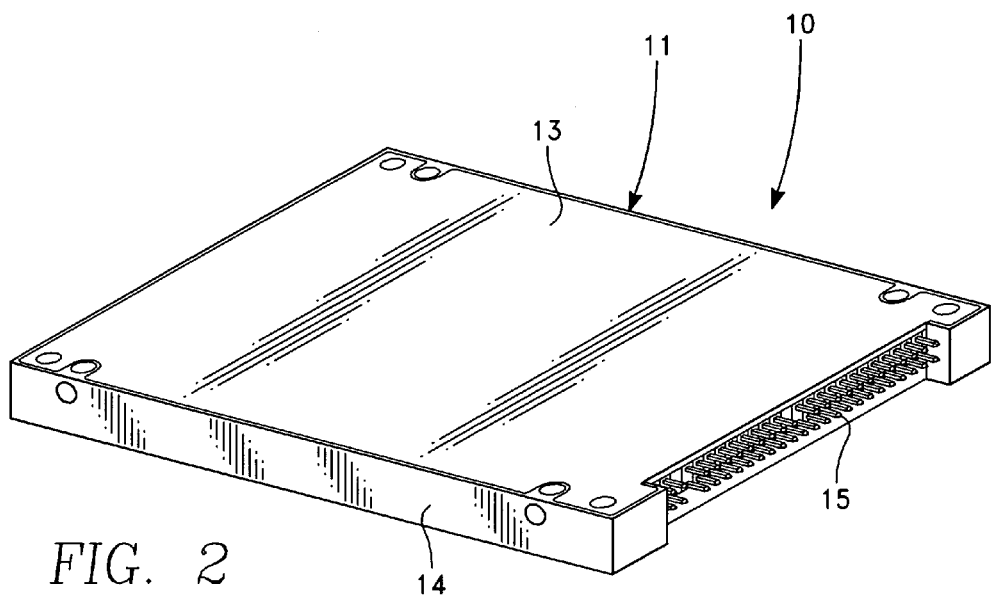

FIGS. 1 and 2 show top and bottom perspective views of an exemplary, vibration-resistant, rugged, solid state hard drive with silicone gel damping 10. Enclosure 11 includes top panel 12 and bottom panel 13 attached to four-sided frame 14. Electrical connectors 15 protrude from one end of frame 14.

Figure 3:
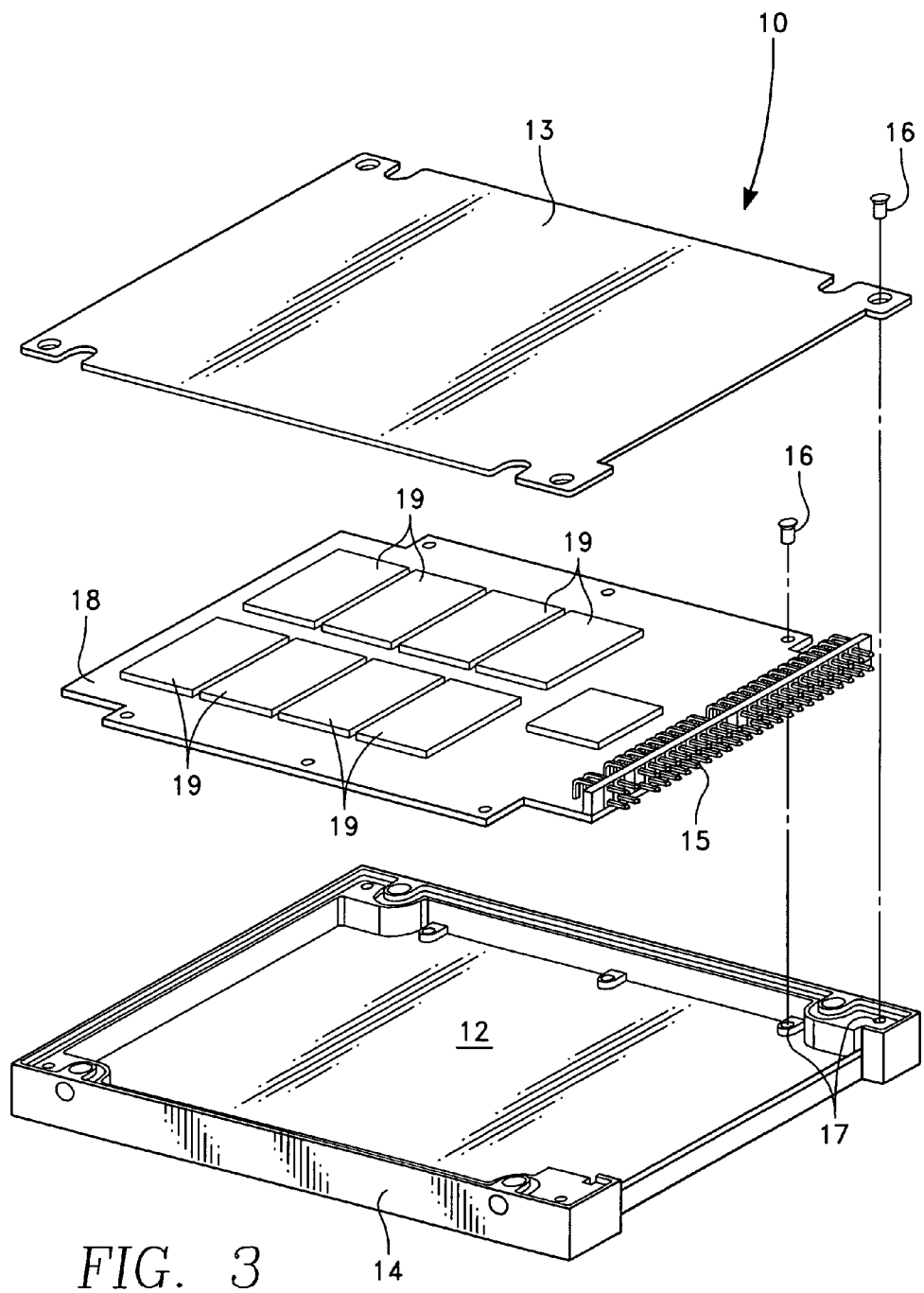
FIG. 3 shows an exploded perspective assembly view of the drive of FIGS. 1 and 2.

FIG. 3 shows an exploded, assembly view of drive 10. PC board 18 is placed inside enclosure 11, and is held in place by fasteners such as fasteners 16 that seat in openings 17. PC board 18 includes attached integrated circuits and/or other electronics 19. See also FIG. 4. Above and below PC board 18, and inside enclosure 11 is silicone gel 20, which dampens vibrations that drive 10 may suffer. The quantity of gel may be sufficient to fill 90% or more, and sometimes 95% or more of the volume within enclosure 11.

Board 18 lies in a plane that is between, and parallel to top panel 12 and bottom panel 13, and is free to flex within enclosure 11 along an axis of board 18 when drive 10 is subjected to shock, or vibration. Enclosure 11 includes gaps, between the panels 12/13 and the inner surfaces of enclosure 11, filled with silicone gel to cover components 19 on board 18.

Figure 4:
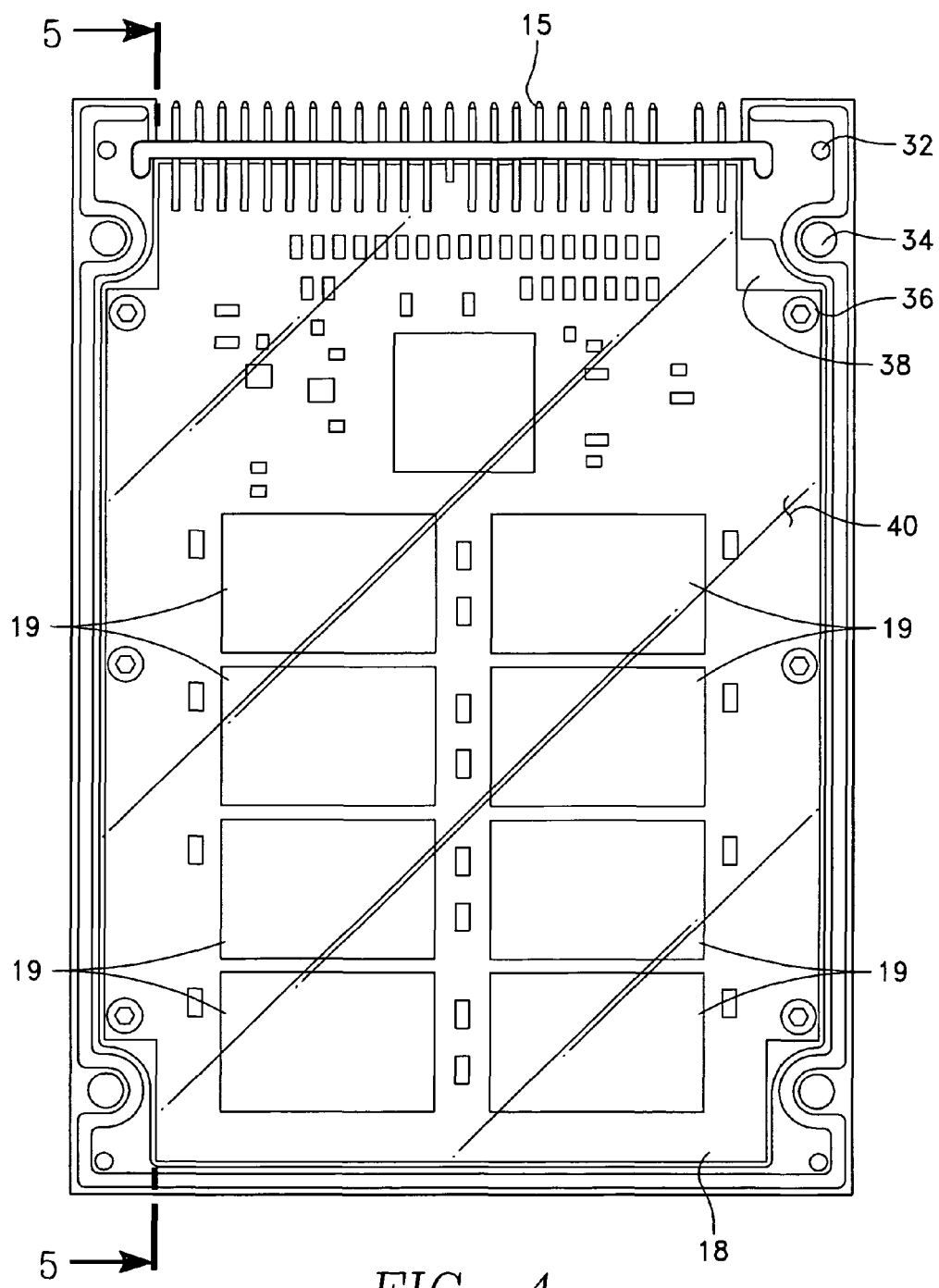
FIG. 4 shows a top plan view of the PC board in the drive of FIGS. 1 and 2.

FIG. 4 also shows top panel attachment holes 32, openings 34 for flow of silicone gel 40 from one side of PCB board 18 to the other, drive mounting holes 34, PCB board mounting holes 36, and spaces 38 through which silicone gel may flow.

Figure 5:
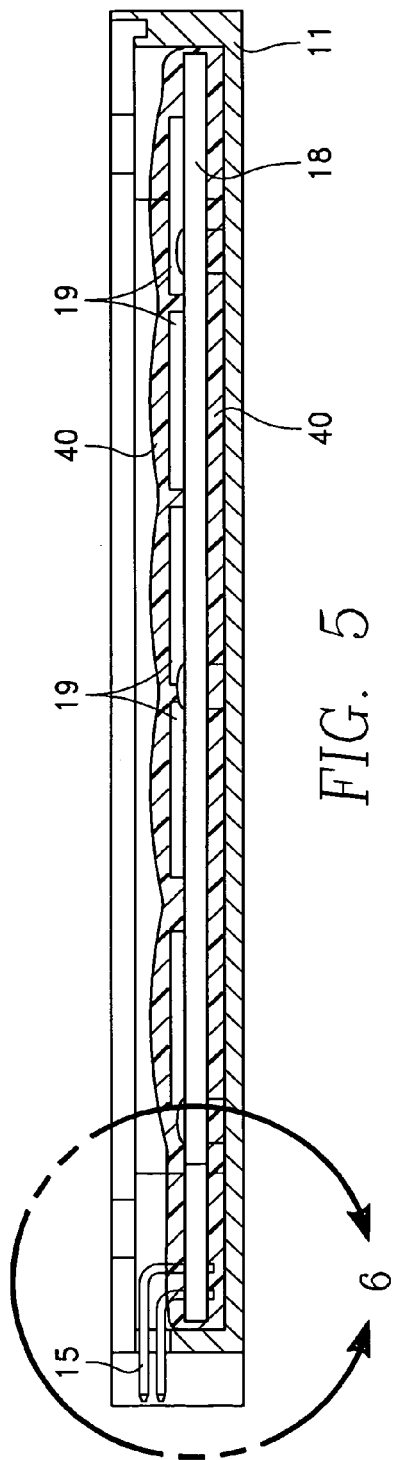
FIG. 5 shows a side elevation view, taken in cross-section on line 5-5 of FIG. 4, of the drive shown in FIGS. 1 and 2.
Figure 6:
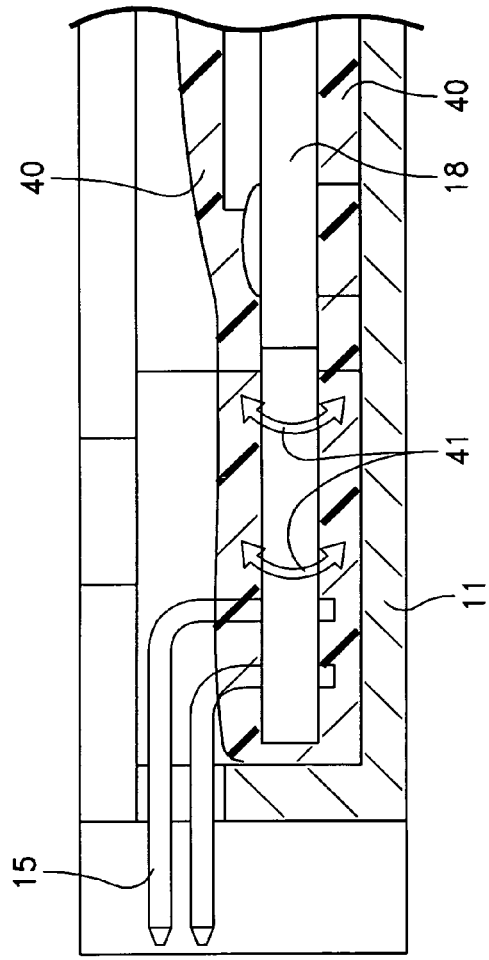
FIG. 6 shows an exploded detail view of encircled portion 6 in FIG. 5.

FIGS. 5 and 6 show silicone gel 40 inside enclosure 11, and also show the flow/passage 41 of gel 40 from one side to the other of PCB board 18.

The above-described embodiment of this invention is exemplary, and is not meant to limit the scope of the claims.

What is claimed is:

1. A ruggedized solid state hard drive comprising: a circuit board mounted in an enclosure in a plane that is between and parallel to two walls of said enclosure, said circuit board being free to flex within said enclosure along at least one axis of said circuit board wherein said enclosure includes gaps between said circuit board and inner surfaces of said enclosure, said gaps including sufficient silicone gel to cover electrical components on said circuit board and dampen said flex of said circuit board within said enclosure, wherein said enclosure comprises at least two mating shallow components including a substantially flat rectangular area, said enclosure having an outstanding walls along each side and attachment between said mating components said enclosure including an opening to receive a connection from said circuit board.

2. The ruggedized solid state hard drive according to claim 1, wherein:
    said enclosure includes a peripheral gap between said inner surfaces of said enclosure and said circuit board to permit said silicone gel to flow from one side of said circuit board to an other side of said circuit board.

3. The ruggedized solid state hard drive according to claim 2, wherein:
    said silicone gel occupies more than about 90% of the volume inside said enclosure.

4. The ruggedized solid state hard drive according to claim 1, wherein:
    said silicone gel occupies more than about 90% of a volume inside said enclosure.

5. The ruggedized solid state hard drive according to claim 1, wherein:
    said circuit board is subject to said flex when said hard drive is subjected to at least one of shock, vibration, oscillation, and periodic/aperiodic movement.

* * * * *